United States Patent
Guo et al.

(10) Patent No.: US 11,196,288 B2
(45) Date of Patent: Dec. 7, 2021

(54) DIRECT CURRENT POWER SUPPLY SYSTEM

(71) Applicant: Delta Electronics,Inc., Taoyuan (CN)

(72) Inventors: Xingkuan Guo, Taiwan (CN); Xinmin Bai, Taoyuan (CN)

(73) Assignee: Delta Electronics, Inc., Taoyuan (TW)

( * ) Notice: Subject to any disclaimer, the term of this patent is extended or adjusted under 35 U.S.C. 154(b) by 100 days.

(21) Appl. No.: 16/386,738

(22) Filed: Apr. 17, 2019

(65) Prior Publication Data
US 2020/0059111 A1    Feb. 20, 2020

(30) Foreign Application Priority Data
Aug. 20, 2018  (CN) .......................... 201810949726.8

(51) Int. Cl.
| | | |
|---|---|---|
| *H02J 9/06* | (2006.01) | |
| *G01R 31/3842* | (2019.01) | |
| *H02J 7/00* | (2006.01) | |
| *H02J 7/04* | (2006.01) | |

(52) U.S. Cl.
CPC .......... *H02J 9/061* (2013.01); *G01R 31/3842* (2019.01); *H02J 7/0063* (2013.01); *H02J 7/04* (2013.01)

(58) Field of Classification Search
CPC . H02J 9/061; H02J 7/0063; H02J 7/04; G01R 31/3842
USPC ...................................................... 307/66, 64
See application file for complete search history.

(56) References Cited

U.S. PATENT DOCUMENTS

| | | | | |
|---|---|---|---|---|
| 5,803,215 A | * | 9/1998 | Henze ..................... | B60L 55/00 |
| | | | | 191/2 |
| 5,990,577 A | * | 11/1999 | Kamioka ................ | H04L 12/44 |
| | | | | 307/26 |
| 9,857,855 B2 | * | 1/2018 | Kaplan ................ | H05K 7/1492 |
| 10,537,046 B1 | * | 1/2020 | Ledezma ................ | H02P 27/08 |
| 2002/0134567 A1 | * | 9/2002 | Rasmussen ............. | G06F 1/189 |
| | | | | 174/50 |

(Continued)

FOREIGN PATENT DOCUMENTS

| | | |
|---|---|---|
| CN | 102394557 A | 3/2012 |
| CN | 102891613 A | 1/2013 |

OTHER PUBLICATIONS

The CN1OA dated Feb. 3, 2020 by the CNIPA.

*Primary Examiner* — Michael R. Fin
(74) *Attorney, Agent, or Firm* — Qinghong Xu

(57) ABSTRACT

A direct current power supply system includes at least one first input source, a second input source, a phase shifting transformer set, a rectifier set and a monitoring module. The phase shifting transformer set is for converting a medium voltage alternating current of the first input source and/or the second input source to a low voltage alternating current. The rectifier set is for rectifying the low voltage AC to a low voltage DC. The phase shifting transformer set and the rectifier set are disposed either in a power supply housing, or in two adjacent power supply housings. The monitoring module includes a phase shifting transformer monitoring unit for retrieving at least one of temperature data, voltage data and current data of the phase shifting transformer set and a rectifier monitoring unit for retrieving at least one of temperature data, voltage data and current data of the rectifier set.

8 Claims, 4 Drawing Sheets

(56) References Cited

U.S. PATENT DOCUMENTS

2013/0307486 A1 11/2013 Chang

* cited by examiner

DIRECT CURRENT POWER SUPPLY SYSTEM

CROSS REFERENCE

This application is based upon and claims the benefit of priority of Chinese Patent Applications No. 201810949726.8, filed on Aug. 20, 2018, the entire contents thereof are incorporated herein by reference.

TECHNICAL FIELD

The present disclosure relates to the field of power supplying and distribution, specifically to a direct current (DC) power supply system.

BACKGROUND

The power capacity of a large scale data center is generally in the tens of MW class. In order to ensure having stable and efficient power supply during malfunctions happened in providing alternating current (AC), the demands of reliability of the power supplying and distribution are quite high for reducing the maintenance fee of the large scale data center.

In the existing structure of the power supplying and distribution system of the data center, the power supplying and distribution system includes the ways of AC power in combination with generators, AC UPS including batteries or DC UPS including batteries. In order to improve the reliability of power supplying, the generators, UPS and the distribution units are necessary to be considered redundant design.

In the existing power supplying design, the inputs of the power supplying and the distribution system of the data center are couple to the power frequency transformer set. The power frequency transformer set is coupled to the rectifier set.

The power frequency transformer set and the rectifier set are respectively disposed in a long distance, even in the different floors, which will cause the complexity in redundancy configuration and bring lacks in efficiency and reliability of the power supply system.

SUMMARY

In the light of the problems of the prior art, an objective of the present disclosure is to provide a DC power supplying system to solve the problems of the prior art. The present disclosure reduces the complexity of the wire layout design, length of the wires, cost and wearing of wirings. Moreover, since the wire layout is simplified, safety and stability of the DC power supply system are enhanced, and reliability and efficiency are improved.

In one embodiment of the present disclosure, a direct current (DC) power supply system includes at least one first input source, a second input source, a phase shifting transformer set, a rectifier set and a monitoring module. The phase shifting transformer set includes at least one phase shifting transformer, wherein the first input source and the second source are respectively coupled, via a first switch and a second switch, to the phase shifting transformer set and the phase shifting transformer is configured to convert a medium voltage alternating current (AC) of the first input source and/or the second input source to a low voltage AC. The rectifier set includes at least one rectifier, configured to rectifying the low voltage AC to a low voltage DC, wherein the phase shifting transformer set and the rectifier set are disposed in a power supply box/cabinet, or the phase shifting transformer set and the rectifier set are respectively disposed in two adjacent power supply box/cabinets, wherein the two adjacent power supply box/cabinets are distant from each other within one meter. The monitoring module includes a phase shifting transformer monitoring unit and a rectifier monitoring unit, wherein the phase shifting transformer monitoring unit is configured to retrieve at least one of temperature data, voltage data and current data of the phase shifting transformer set, and the rectifier monitoring unit is configured to retrieve at least one of temperature data, voltage data and current data of the rectifier set.

By using the DC power supply system of the present disclosure, the phase shifting transformer set, the rectifier set and the monitoring module are integrated into a power supplying system in a modular manner. The power supplying system is used for efficiently and reliably converting the medium voltage AC or ACs transmitted from other input source to the DC power which is used by the data center. The circuit complexity between the various module components of the power supplying system is then reduced. Moreover, and the wiring layout cost and power loss are reduced as well. Furthermore, the monitoring module is used to monitor the working state of each module or components in the power supplying system to improve the stability and reliability of the power supply system.

In order to further understand the features and technical contents of the present disclosure please refer to the following detailed description and drawings related to the present disclosure. However, the detailed description and the drawings are merely illustrative of the disclosure and are not intended to limit the scope of the claims.

BRIEF DESCRIPTION OF THE DRAWINGS

Embodiments of the present disclosure will now be described, by way of example only, with reference to the accompanying schematic drawings in which corresponding reference symbols indicate corresponding parts, and in which.

DETAILED DESCRIPTION

In the following, embodiments of the present disclosure will be described in detail referring to figures. The concept and its realizations of the present disclosure can be implemented in a plurality of forms, and should not be understood to be limited to the embodiments described hereafter. In contrary, these embodiments are provided to make the present disclosure more comprehensive and understandable, and so the conception of the embodiments can be conveyed to the technicians in the art fully. Same reference signs in the figures refer to same or similar structures, so repeated description of them will be omitted.

The present disclosure provides a DC power supply system that converts medium voltage alternating current (AC) or other input sources into direct current (DC) power required by the data center in a more efficient and reliable manner. The medium voltage AC voltage is between 6 kV and 35 kV.

Figure 1:
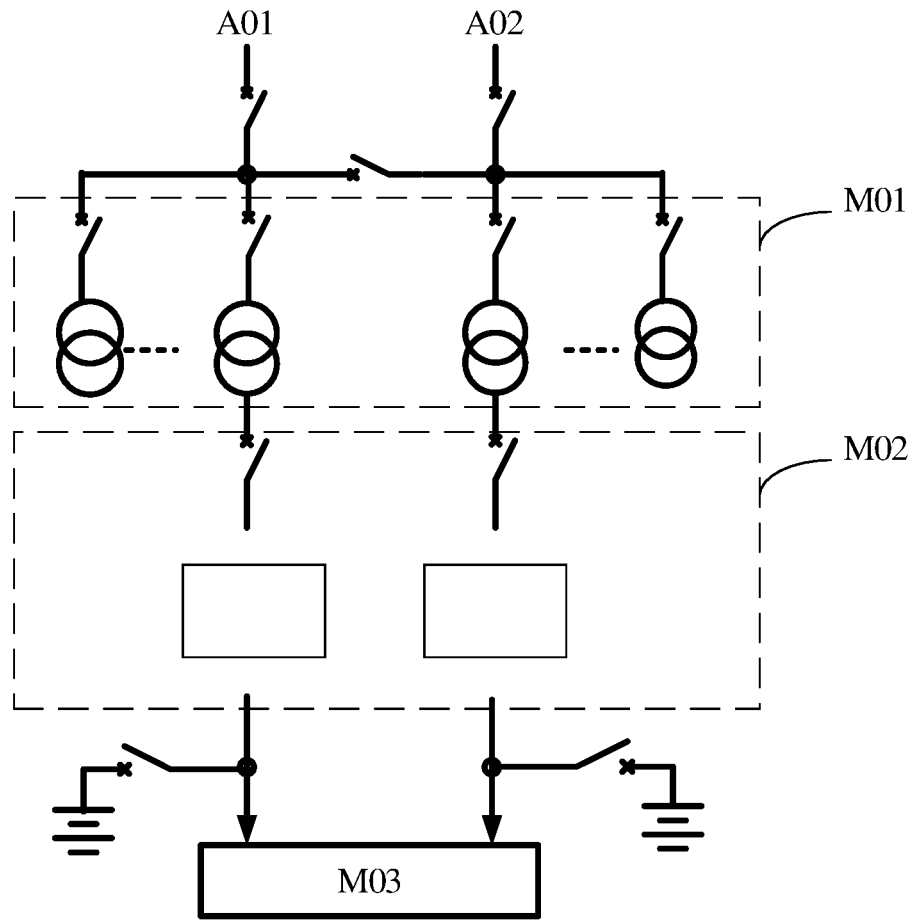
FIG. 1 shows a schematic view of a prior art of a direct current (DC) power supply system.

FIG. 1 shows a schematic view of a prior art of a direct current (DC) power supply system. As shown in FIG. 1, a DC UPS power supply system with redundant design is provided. A01 represents an input source provided by an electrical grid and A02 represents an input source provided by a diesel generator. The electrical grid in combined with the generator provides 10 kVac medium voltage busbar network. An AC transformer set M01 connected to the medium voltage busbar network for converting the medium AC voltage to a low AC voltage which is then rectified by the rectifier M02 to a 270 Vdc DC or a 380 Vdc DC and distributed to a load M03. In this embodiment, the transformer set includes the DC UPS having a battery and the battery is directly connected to the DC bus to ensure uninterrupted power supply. In some embodiments, a load includes two DC busbars for providing power (1+1 redundancy) to improve the power supply reliability. In this embodiment, the AC transformer set and the rectifier set are dispersed in the machine room. In some embodiments, the AC transformer set and the rectifier set are respectively disposed in the different floors which will cause the complexity in redundancy configuration and bring lacks in efficiency and reliability of the power supply system. Therefore, the followings provide a modular approach.

Figure 2:
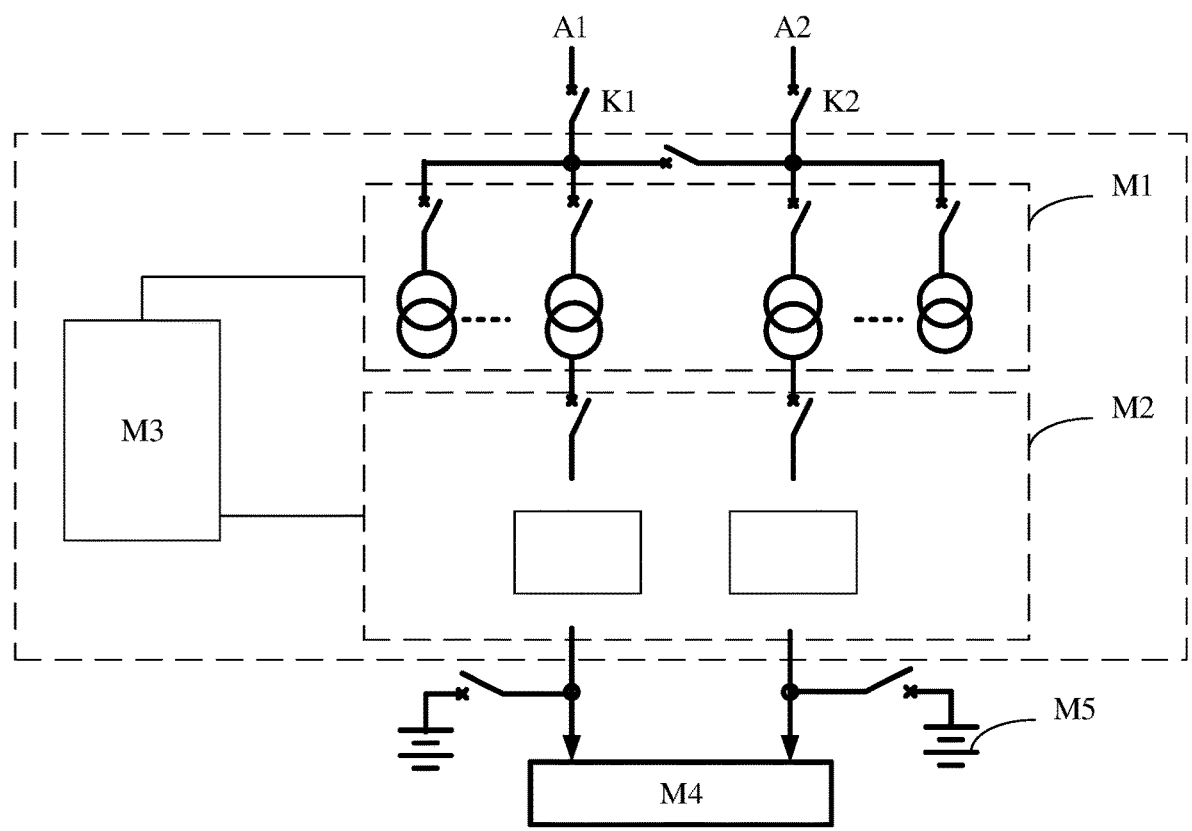
FIG. 2 shows a schematic view of a DC power supply system of one embodiment of the present disclosure.

FIG. 2 shows a schematic view of a DC power supply system of one embodiment of the present disclosure. As shown in FIG. 2, the DC power supply system includes a first input source A1 and a second input source A2 for receiving medium voltage AC, a phase shifting transformer set M1 including at least one phase shifting transformer, wherein the first input source A1 and the second source A2 are respectively coupled, via a first switch K1 and a second switch K2, to the phase shifting transformer set M1 and the phase shifting transformer is configured to convert a medium voltage AC of the first input source A1 and/or the second input source A2 to a low voltage AC, a rectifier set M2 including at least one rectifier configured to rectify the low voltage AC to a low voltage DC, and a monitoring module M3 including a phase shifting transformer monitoring unit and a rectifier monitoring unit, wherein the phase shifting transformer monitoring unit is configured to retrieve at least one of temperature data, voltage data and current data of the phase shifting transformer set M1, and the rectifier monitoring unit is configured to retrieve at least one of temperature data, voltage data and current data of the rectifier set M2. In this embodiment, a power converting module includes a phase shifting transformer and a rectifier, which is able to convert medium voltage AC of one input source to low voltage DC.

In this embodiment, in the power supply system, the phase shifting transformer set M1 is a component for converting the medium voltage AC to the low voltage AC. Compared with the AC transformer set M01 of prior art, in this embodiment, the power factor is then improved during the converting process. Moreover, since the secondary side of each phase of shifting transformer includes six windings which will cause complicated wiring. Furthermore, if the rectifier is located far away the phase shifting transformer, the wirings between the rectifier and the phase shifting transformer will become complicated which increases cost and loss.

Therefore, in this embodiment, the phase shifting transformer set M1 and the rectifier set M2 are modular, and are then disposed in a power supply box/cabinet. In some embodiments, the phase shifting transformer set M1 and the rectifier set M2 are respectively disposed in two adjacent power supply boxes/cabinets, wherein the two adjacent power supply boxes/cabinets are distant from each other within one meter.

Therefore, in this embodiment, the DC power supply system, for converting the medium voltage AC to the low voltage DC, includes the modular phase shifting transformer set M1 and the modular rectifier set M2, which reduces the complexity of the wire layout design, length of the wires, cost and loss of wirings. Moreover, since the wire layout is simplified, safety and stability of the DC power supply system are enhanced, and reliability and efficiency are improved.

In this embodiment, each load M4 includes two DC power supply lines which are respectively coupled to two power converting modules (1+1 redundancy). The power supply reliability to the load is then improved as well.

The first input source A1 and the second input source A2 are selected as the power input in response to the requirements. In one embodiment of the present disclosure, the first input source A1 is an AC input of the electrical grid and the second input source A2 is an AC input of the diesel generator. Therefore, the AC input of the first input source A1 is then controlled by the first switch K1. The AC input of the second input source A2 is then controlled by the second switch K2. The AC input of the diesel generator, in this embodiment, is a back up input source to the grid input source which improves the reliability of powering the load.

In one embodiment of the present disclosure, the first input source A1 is an AC input 1 of the electrical grid 1 and the second input source A2 is an AC input 2 of the electrical grid 2. Therefore, when the DC power supply system is powering the load, another input source is a back up input source to the grid input source which improves the reliability of powering the load.

In some embodiments, the number and the types of the input source for providing efficient and reliable medium voltage AC are within the scope of the present disclosure.

In addition, in some embodiments, the number of the loads is modified in response to the requirements and the input source redundancy of each load is various as well. For example, in some embodiments, a load includes a redundant power converting module or a load includes a plurality of redundant power converting modules which are within the scope of the present disclosure.

Figure 3:
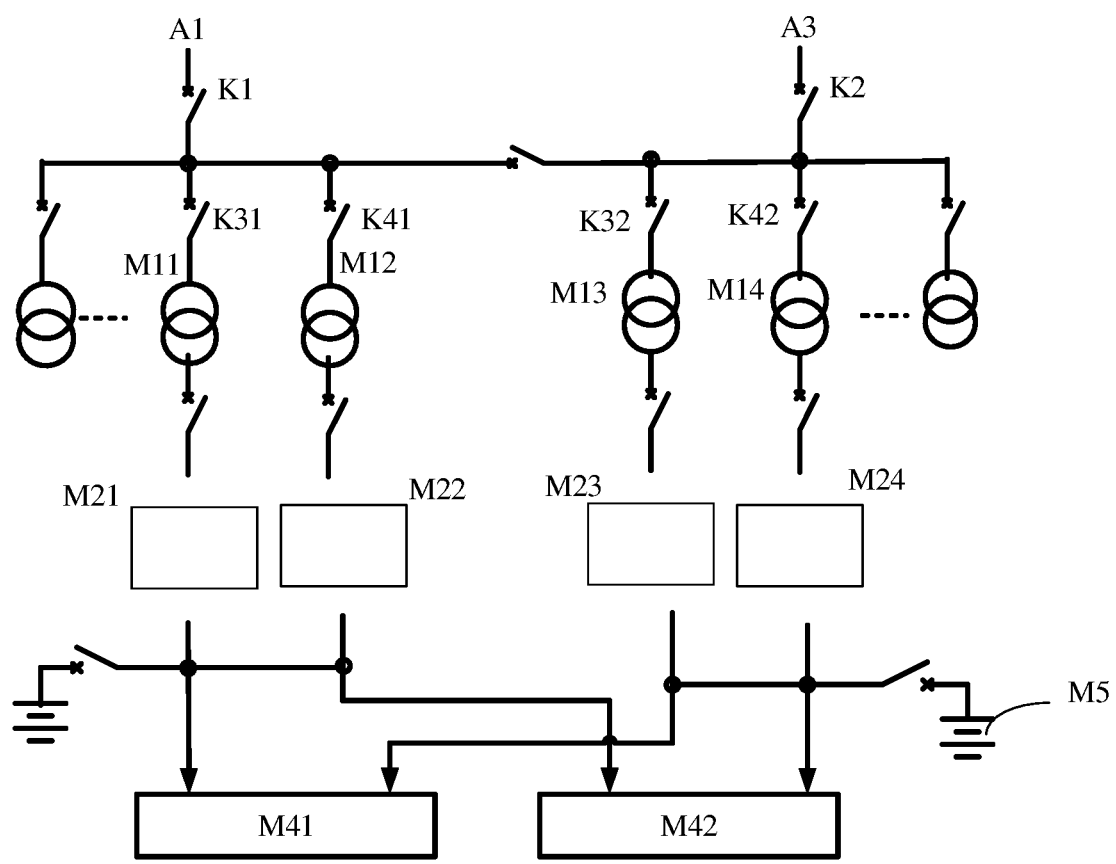
FIG. 3 shows a schematic view of a DC power supply system of another embodiment of the present disclosure.

Furthermore, FIG. 3 shows a schematic view of a DC power supply system of another embodiment of the present disclosure. As shown in FIG. 3, compared with the DC power supply system of FIG. 2, the DC power supply system of FIG. 3 includes two loads M41 and M42, and each load includes a power converting module including a phase shifting transformer and a rectifier for powering the loads with DC. As shown in FIG. 3, a first end of a first switch K1 is coupled to the first input source A1. A second end of a first switch K1 is coupled to a second end of the second switch K2 and a first end of the second switch K2 is coupled to the second input source A2. A first end of a first sub-switch K31 of a third switch is coupled to the second end of the first switch K1 and a second end of the sub-switch K31 of the third switch is coupled to an input end of the phase shifting transformer set M11. An output end of the phase shifting transformer M11 is then powering the DC to the load M41 via the rectifier M21. A first end of a fourth switch K41 is coupled to the second end of the first switch K1. A second end of a first sub-switch K41 of the fourth switch is coupled to the input end of the phase shifting transformer M12. The phase shifting transformer M12 is powering the load M42 via the rectifier M22. The first sub-switch K31 of the third switch and the first switch K41 of the fourth switch implement the current transmission control of the input sources and the power converting modules of the two loads. Furthermore, in order to implement the redundancy configuration of the power supply system and improve reliability and stability of the power supplying, each load includes a redundant power converting module. As shown in the FIG. 3, a backup power converting module of the load M41 includes the phase shifting transformer M13 and the rectifier M23. A backup power converting module of the load M42 includes the phase shifting transformer M14 and the rectifier M24. Moreover, the current transmission between the input sources and the two backup power converting modules is controlled by a second sub-switch K42 of the fourth switch and a second sub-switch K32 of the third switch. In some embodiments, a first end of the second sub-switch K32 of the third switch is coupled to the second end of the second switch K2. A second end of the second sub-switch K32 of the third switch is coupled to an input end of the phase shifting transformer M13. Therefore, the second sub-switch K32 of the third switch controls the current transmission between an input source and the backup power converting module of the load M41. A first end of the second sub-switch K42 of the fourth switch is coupled to a second end of the second switch K2. A second end of the second sub-switch K42 of the fourth switch is coupled to the input end of the phase shifting transformer M14. Thus, the second sub-switch K42 of the fourth switch controls the current transmission between an input source and the backup power converting module of the load M42.

In this embodiment, for the sake of simplicity, only two loads are shown and each load includes two power converting modules (a main power converting module and a backup power converting module). In the practical applications, the number of the loads is modified in response to the requirements or the power supplying capability of power supplying system, which means the number of the power converting module is increased in response to the requirements or the power supplying capability of power supplying system. The power converting module of the load M41 includes the first phase shifting transformer set including at least one phase shifting transformer and the first rectifier set. In this embodiment, the first phase shifting transformer set includes the phase shifting transformer M11 and the phase shifting transformer M13. The first rectifier set includes the rectifiers M21 and M23, respectively arranged in response to the transformers, M11 and M13, of the first phase shifting transformer set and the power converting module of the load M41 is coupled to the input source via the third switch. In some embodiments, the third switch is a single switch for controlling the current transmission between the input source and the first phase shifting transformer. Moreover, in some embodiments, the third switch includes plurality of switches corresponding to the phase shifting transformers of the phase shifting transformer set includes respectively, such as the first sub-switch K31 of the third switch and the second sub-switch K32 of the third switch. The switches of the third switch are used for controlling the current transmission between the input source and the phase shifting transformers respectively. Moreover, the power converting module of the load M42 includes the second phase shifting transformer and the second rectifier set. The second phase shifting transformer includes at least one phase shifting transformer, i.e. the phase shifting transformers M12 and M14. The second rectifier set includes the rectifiers, i.e. the rectifiers M22 and M24, respectively arranged in response to the phase shifting transformers.

The power converting module of the load M42 is coupled to the input source via the fourth switch. In some embodiments, the fourth switch is a single switch for controlling the current transmission between the input source and the second phase shifting transformer. Moreover, in some embodiments, the fourth switch includes plurality of switches corresponding to the phase shifting transformers of the phase shifting transformer set respectively, such as the first sub-switch K41 of the fourth switch and the second sub-switch K42 of the fourth switch. The switches of the fourth switch are used for controlling the current transmission between the input source and the phase shifting transformers respectively.

When the power distribution unit does not receive the low voltage DC from the rectifier, the power of the battery M5, transmitted via the charging and discharging end of the battery, is distributed by the distribution unit, to each load.

Therefore, the distribution unit includes two modes which are respectively an input source power supplying mode and a battery power supplying mode. The battery is charged when the distribution unit is under the input source power supplying mode and the power of the battery is low.

When there is no power provided by the input source, the battery M5 is capable of providing emergency power to each load to ensure work stability of each load. In some embodiments, the battery M5 is capable of providing stable currents to the load when the input voltage provided by the input source is unstable. After the input voltage provided by the input source is stable, the distribution unit is then changed to the input source power supplying mode.

Figure 4:
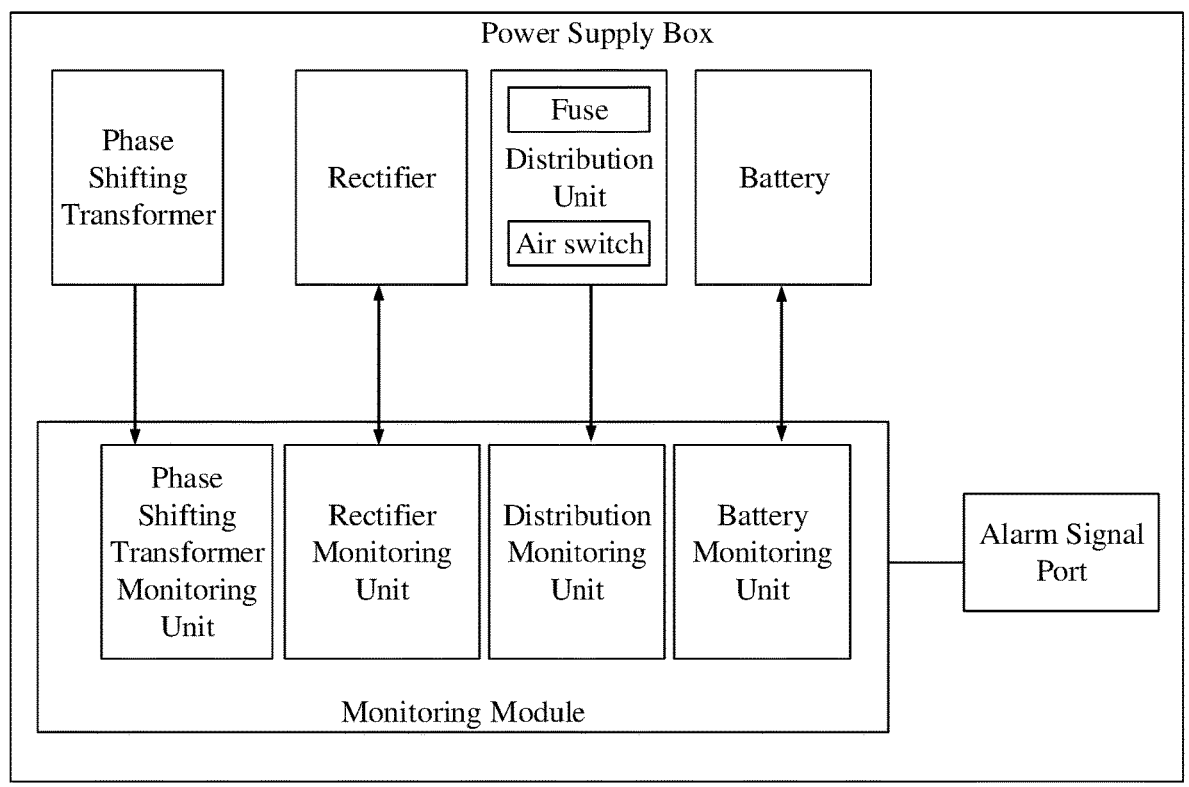
FIG. 4 shows a schematic block diagram of a DC power supply system of another embodiment of the present disclosure.

FIG. 4 shows a schematic block diagram of a DC power supply system of another embodiment of the present disclosure. As shown in FIG. 4, for real time monitoring working status of the distribution unit, the monitoring module further includes a power distribution monitoring unit configured to monitor the air switch state and/or the fuse state of the power distribution unit.

The monitoring module includes a battery monitoring unit configured to monitor the voltage of the battery, and the charge current and the discharge current of the battery, which allows the monitoring module to monitor the rest power of the battery and the working state of the battery.

Furthermore, in some embodiments, the distribution unit and the monitoring module are disposed in a power supplying box/cabinet. In some other embodiments, the distribution unit, the battery, the phase shifting transformer set, the rectifier set and the monitoring module are disposed in a power supplying box/cabinet. The goal of a power supplying integrated with components in a modular manner is then achieved. The real time monitoring for controlling the voltage of transforming and rectifying is also achieved by monitoring the status of the DC power supplying system to ensure providing accurate and reliable power to data center.

Furthermore, the power supply box/cabinet further includes an alarm signal port coupled to the monitoring module. When the parameters, monitored by the monitoring module, are greater than a threshold, an alarm signal is then triggered and transmitted via the alarm signal port.

In summary, by using the DC power supply system of the present disclosure, the phase shifting transformer set, the rectifier set and the monitoring module are integrated into a power supplying system in a modular manner. The power supplying system is used for efficiently and reliably converting the grid or ACs transmitted from other input source to the DC power which is used by the data center. The circuit complexity between the various module components of the power supplying system is then reduced. Moreover, the wiring layout cost and power loss are reduced as well. Furthermore, the monitoring module is used to monitor the working state of each module or components in the power supplying system to improve the stability and reliability of the power supply system.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A direct current (DC) power supply system comprising:
   at least one first input source and a second input source;
   a phase shifting transformer set including at least one phase shifting transformer, wherein the first input source and the second source are respectively coupled, via a first switch and a second switch, to the phase shifting transformer set and the phase shifting transformer is configured to convert a medium voltage alternating current (AC) of the first input source and/or the second input source to a low voltage AC;
   a rectifier set including at least one rectifier, configured to rectify the low voltage AC to a low voltage DC, wherein the phase shifting transformer set and the rectifier set are disposed in one same power supply box/cabinet; and
   a monitoring module including a phase shifting transformer monitoring unit and a rectifier monitoring unit, wherein the phase shifting transformer monitoring unit is configured to retrieve at least one of temperature data, voltage data and current data of the phase shifting transformer set, and the rectifier monitoring unit is configured to retrieve at least one of temperature data, voltage data and current data of the rectifier set, the monitoring module and the rectifier are disposed in the power supply box/cabinet;
   wherein the system further includes:
   two of the phase shifting transformer sets, including a first phase shifting transformer set and a second phase shifting transformer set;
   two of the rectifier sets, including a first rectifier set, and a second rectifier set;
   wherein a first end of the first switch coupled to the first input source, a second end of the first switch coupled to a second end of the second switch and a first end of the second switch coupled to the second input source;
   a third switch, wherein a first end of the third switch is coupled to the second end of the first switch and a second end of the third switch is coupled to the first phase shifting transformer set;
   a fourth switch, wherein a first end of the fourth switch is coupled to the second end of the first switch and a second end of the fourth switch is coupled to the second phase shifting transformer set;
   wherein the first phase shifting transformer set is configured to convert the medium voltage AC of the first input source or the second input source to the low voltage AC, and the second phase shifting transformer set is configured to convert the medium voltage AC of the first input source or the second input source to the low voltage AC, by controlling the first switch, the second switch, the third switch and the fourth switch;
   wherein the first rectifier set is configured to rectify the low voltage AC of the first phase shifting transformer to a low voltage DC and the second rectifier set is configured to rectify the low voltage AC of the second phase shifting transformer to a low voltage DC.

2. The DC power supply system of claim 1 further comprising a power distribution unit configured to distribute the low voltage DC of the rectifiers to each load.

3. The DC power supply system of claim 2, wherein the monitoring module and the power distribution unit are disposed in the power supply box/cabinet.

4. The DC power supply system of claim 2, wherein the monitoring module further includes a power distribution monitoring unit configured to monitor air switch state and/or fuse state of the power distribution unit.

5. The DC power supply system of claim 2 further includes a battery, wherein the charging and discharging end of the battery are electrically coupled to the power distribution unit and the low voltage DC, received by the power distribution unit from the rectifier, is used for charging the battery via the charging and discharging end of the battery, when the power of the battery is lower than a pre-defined threshold;
   wherein when the power distribution unit does not receive the low voltage DC from the rectifier, the power of the battery, transmitted via the charging and discharging end of the battery, is distributed by the distribution unit to each load.

6. The DC power supply system of claim 5, wherein the monitoring module further include a battery monitoring unit configured to monitor the voltage of the battery, and the charge current and the discharge current of the battery.

7. The DC power supply system of claim 5, wherein the monitoring module further include a power distribution monitoring unit and a battery monitoring unit, wherein the phase shifting transformer set, the rectifier set, the power distribution unit, the battery and the monitoring module are disposed in the power supply box/cabinet, wherein a power output port of the power supply box/cabinet is coupled to an output port of the power distribution unit.

8. The DC power supply system of claim 1, wherein the power supply box/cabinet further includes an alarm signal port coupled to the monitoring module.

* * * * *